(12) United States Patent
Hisanaga et al.

(10) Patent No.: US 8,451,878 B2
(45) Date of Patent: May 28, 2013

(54) SURFACE PROFILE INSPECTION DEVICE

(75) Inventors: Masaru Hisanaga, Anjo (JP); Masataka Toda, Toyohashi (JP); Toshihiko Yoshikawa, Miyoshi (JP)

(73) Assignee: Aisin Seiki Kabushiki Kaisha, Kariya-shi (JP)

( * ) Notice: Subject to any disclaimer, the term of this patent is extended or adjusted under 35 U.S.C. 154(b) by 0 days.

(21) Appl. No.: 13/312,044

(22) Filed: Dec. 6, 2011

(65) Prior Publication Data

US 2012/0147919 A1 Jun. 14, 2012

(30) Foreign Application Priority Data

Dec. 8, 2010 (JP) ................................. 2010-273821

(51) Int. Cl.
*H01S 5/00* (2006.01)
*H01S 5/40* (2006.01)
*H01S 5/022* (2006.01)

(52) U.S. Cl.
CPC .............. *H01S 5/005* (2013.01); *H01S 5/4025* (2013.01); *H01S 5/02248* (2013.01)
USPC .................. 372/50.23; 372/50.12; 372/43.01; 372/24

(58) Field of Classification Search
CPC ..................................................... H01S 5/4025
USPC ............................ 372/50.23, 50.12, 43.01, 24
See application file for complete search history.

(56) References Cited

U.S. PATENT DOCUMENTS

| 5,373,362 | A | * | 12/1994 | Kano et al. | 356/606 |
| 2003/0035461 | A1 | * | 2/2003 | Tsikos et al. | 372/108 |
| 2003/0159299 | A1 | * | 8/2003 | Goodrich | 33/286 |
| 2009/0207380 | A1 | | 8/2009 | Aruga | |
| 2009/0231570 | A1 | | 9/2009 | Toda et al. | |
| 2011/0193952 | A1 | | 8/2011 | Kozakai et al. | |

FOREIGN PATENT DOCUMENTS

| JP | 2001-102681 | 4/2001 |
| JP | 2009-198637 | 9/2009 |
| JP | 2009-222418 | 10/2009 |
| JP | 2010-107300 | 5/2010 |
| JP | 2010-107301 | 5/2010 |

OTHER PUBLICATIONS

Extended European Search Report issued Mar. 20, 2012 in Patent Application No. 11192308.2.

* cited by examiner

*Primary Examiner* — Kinam Park
(74) *Attorney, Agent, or Firm* — Oblon, Spivak, McClelland, Maier & Neustadt, L.L.P.

(57) ABSTRACT

A surface profile inspection device producing a sheet of light propagating in a linear region forming a plane from a laser beam emitted from a laser light source and irradiating the sheet of light to an object to be measured, and including an image capturing unit capturing an image of the object to be measured and a configuration data generating unit extracting a light section line defined by an irradiation of the sheet of light from image data of the captured image and generating surface profile data of the object to be measured. The laser light source includes a semiconductor laser emitting a laser beam from a light emitting layer formed in a linear direction along a boarder of a p-n junction. An attitude of the semiconductor laser is set to arrange the linear direction to be unparallel to a spread direction of the sheet of light.

4 Claims, 5 Drawing Sheets

SURFACE PROFILE INSPECTION DEVICE

CROSS REFERENCE TO RELATED APPLICATIONS

This application is based on and claims priority under 35 U.S.C. §119 to Japanese Patent Application 2010-273821, filed on Dec. 8, 2010, the entire content of which is incorporated herein by reference.

TECHNICAL FIELD

This disclosure generally relates to a surface profile inspection device.

BACKGROUND DISCUSSION

JP2009-222418A (hereinafter referred to as Patent reference 1) discloses a known surface profile inspection device which irradiates a sheet of light generated by a laser light sheet source unit to an object to be measured, captures an image of the object to be measured by an image capturing unit, detects a light section line of the sheet of light from the image data captured by the image capturing unit, and attains the measured data of a three-dimensional profile configuration by the triangulation. According to the construction of Patent reference 1, an inspection result is determined by comparing measured data of the three-dimensional profile configuration and configuration dimension data.

The device disclosed in Patent reference 1 includes an optical system which includes a cylindrical lens for making a sheet of light irradiated from a laser light sheet projector to propagate (spread) in a sector shape in parallel to an optical axis. The optical system produces the sheet of light from high order coherent light and produces a light section line on a surface of the object to be measured by irradiating the sheet of light onto the object to be measured. Then, the optical system extracts (obtains) the light section line in the image data obtained by the image capturing means by processing the image and attains coordinates of the light section line by the principles of triangulation to obtain the surface profile of the object to be measured.

JP2009-198637A (hereinafter referred to as Patent reference 2) discloses a device which includes a poralization modulation portion for reducing a speckle noise accompanied with the irradiation of the coherent light, for example, a laser beam.

According to the construction of the known device, the narrower (the thinner) a linewidth of the light section line of the laser light sheet (the sheet of light) is, that is, the closer an irradiation position of the laser light sheet on the object to be measured to a focal position of the laser beam is, the more detection precision is enhanced because a resolution is increased. However, in a case where the irradiation position of the laser light sheet is away from the focal position of the laser beam, optical coherence is likely to be caused at portions of the light section line and a noise deriving from the optical coherence is likely to be caused in luminance distribution in the image data, thus the extraction of the light section line is assumed to be difficult. Namely, a speckle noise by the optical coherence is likely to be caused at the light section line.

As described in Patent reference 2, the speckle noise appears as fringe patterns in which bright points and dark points are randomly distributed. In a case where the speckle noise is generated at the light section line, the speckle noise causes variations in luminance of the light section line, which brings a drawback that the position of the light section line is assumed to be unclear and the light section line may not be measured. That is, when the speckle noise due to the optical coherence is generated at the light section line according to the known surface profile inspection device, the detection precision of the surface profile of the object to be measured may decline.

A need thus exists for a surface profile inspection device which is not susceptible to the drawback mentioned above.

SUMMARY

In light of the foregoing, the disclosure provides a surface profile inspection device, which includes a laser projecting unit producing a sheet of light propagating in a linear region forming a plane from a laser beam emitted from a laser light source by an optical system and irradiating the sheet of light to an object to be measured, an image capturing unit capturing an image of the object to be measured, and a configuration data generating unit extracting a light section line defined by an irradiation of the sheet of light on the object to be measured from image data of the image captured by the image capturing unit and generating surface profile data of the object to be measured. The laser light source includes a semiconductor laser emitting a laser beam from a light emitting layer formed in a linear direction along a boarder of a p-n junction. An attitude of the semiconductor laser is set to arrange the linear direction to be unparallel to a spread direction of the sheet of light.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

One embodiment of surface profile inspection device will be explained with reference to illustrations of drawing figures as follows.

Figure 1:
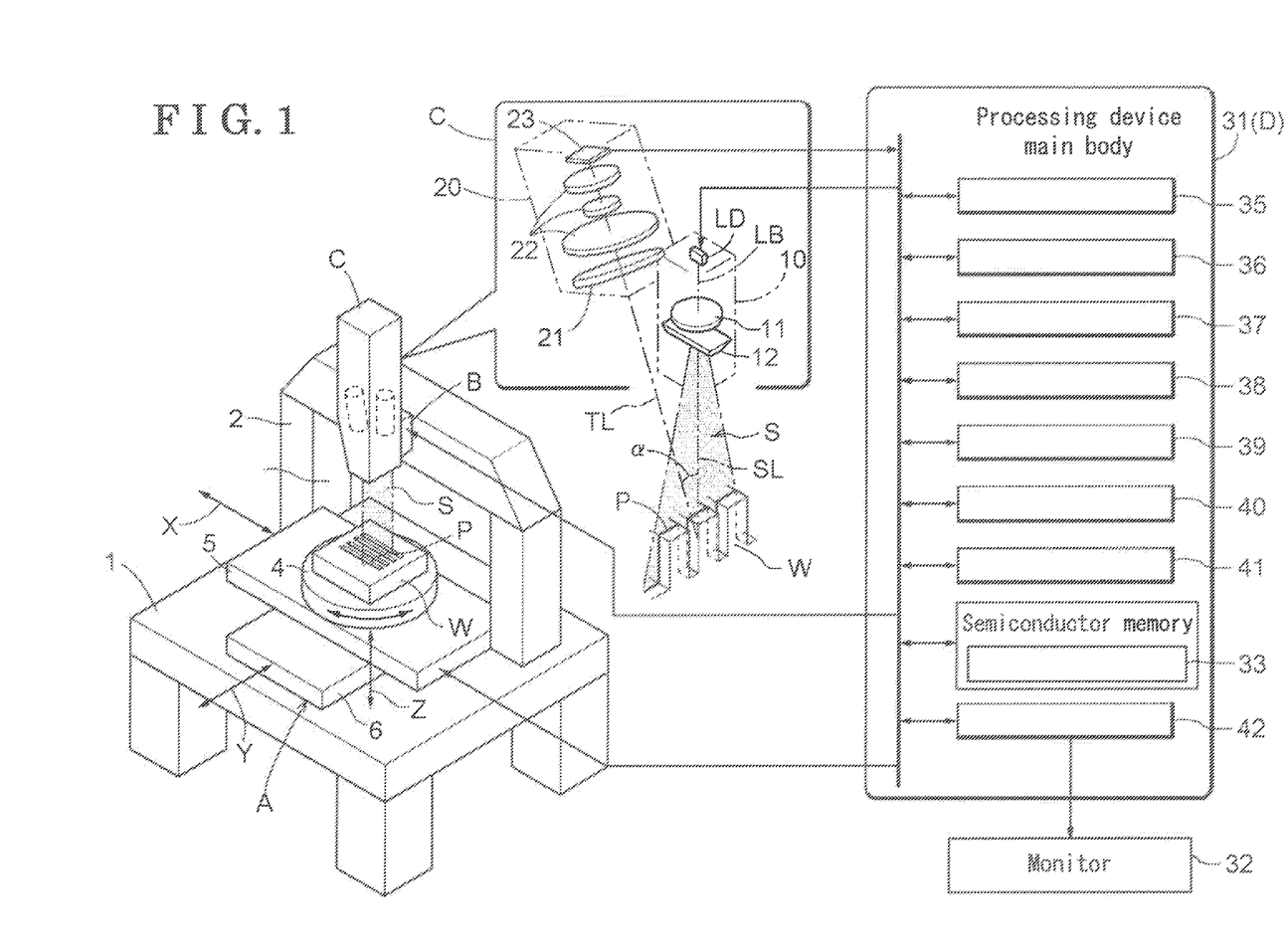
FIG. 1 is an overview of a surface profile inspection device according to an embodiment disclosed here.

As illustrated in FIG. 1, a work piece support unit A is provided at a base 1. The surface profile inspection device includes a measurement unit C provided at an arch shaped frame 2 fixed to the base 1 via an elevation unit B, and a controller D which controls the work piece support unit A and the elevation unit B, irradiates a sheet of light (laser light sheet) S at the measurement unit C, obtains image data at the measurement unit C, and inspects a defect of a surface profile of a work piece W serving as an object to be measured.

The surface profile inspection device starts inspections in response to an operation by an operator in a state where the work piece W (i.e., an example of the object to be measured) is positioned on the work piece support unit A. Upon the start of the inspection, the sheet of light S is irradiated from the measurement unit C onto the work piece W by a control of the controller D, and images are consecutively captured by the measurement unit C while changing relative positions between the work piece W and the measurement unit C by actuating the work piece support unit A. In the image capturing process, the sheet of light S is formed by an optical system so that a laser beam LB from a semiconductor laser LD serving as a laser beam source to be emitted to propagate (spread) to form a plane, and a light section line P is projected on a work piece surface on which the sheet of light S is irradiated. The controller D obtains, or extracts the light section line P from the image data of multiple frames obtained by the image capturing process, generates the measurement three dimensional data based on the positional information of the light section line P, and compares the measurement three dimensional data to a reference three dimensional data 33 serving as master data to evaluate the surface profile of the work piece W.

The work piece support unit A includes a rotatable table 4 formed in a disc shape and rotatable about a longitudinal axis positioned in the center thereof, an X-stage 5 configured to horizontally reciprocate in an X-direction, and a Y-stage 6 configured to horizontally reciprocate in a Y-direction which is orthogonal to the X-direction. The rotatable table 4, the X stage 5, and the Y-stage 6 are piled on one another. The work piece support unit A includes an actuator (e.g., a stepping motor) which independently actuates the rotatable table 4, the X-stage 5, and the Y-stage from one anther, a rotational angle sensor detecting a rotational attitude of the rotatable table 4, and a positional sensor detecting positions of the X-stage 5 and the Y-stage 6 independently from one another.

Thus, in a state where the work piece W is positioned on the rotatable table 4, the image capturing is performed in a condition that the relative positions between the work piece W and the measurement unit C are changed by rotating the rotatable table 4, by linearly moving the X-stage 5 in the X-direction, and by moving the Y-stage 6 in the Y-direction.

The elevation unit B includes a mechanism for movably supporting the measurement unit C in an upward-downward direction relative to the frame 2, an actuator actuating the measurement unit C in the upward-downward direction, and a positional sensor detecting the position of the measurement unit C. Relative positions between the measurement unit C and the work piece W in a z-direction (elevation direction) are changed by the elevation unit B.

The measurement unit C includes a case which houses a laser beam projector 10 serving as a laser projecting unit or a laser projecting means irradiating the sheet of light S and an image capturing unit 20 serving as an image capturing unit or an image capturing means which captures an image of the work piece W on which the sheet of light S is irradiated. The measurement unit C is arranged so that an angle α obtained by crossing an optical axis SL of the sheet of light S irradiated from the laser beam projector 10 and an image capturing axis TL of an image capturing lens 22 of the image capturing unit 20 is, for example, set to be approximately eleven degrees. The angle α may be set to be a value appropriate for the image capturing process by the image capturing unit 20. For example, the angle α may be set to be a value with which the optical axis SL and the image capturing axis TL do not interfere with each other up to ninety degrees.

Figure 2:
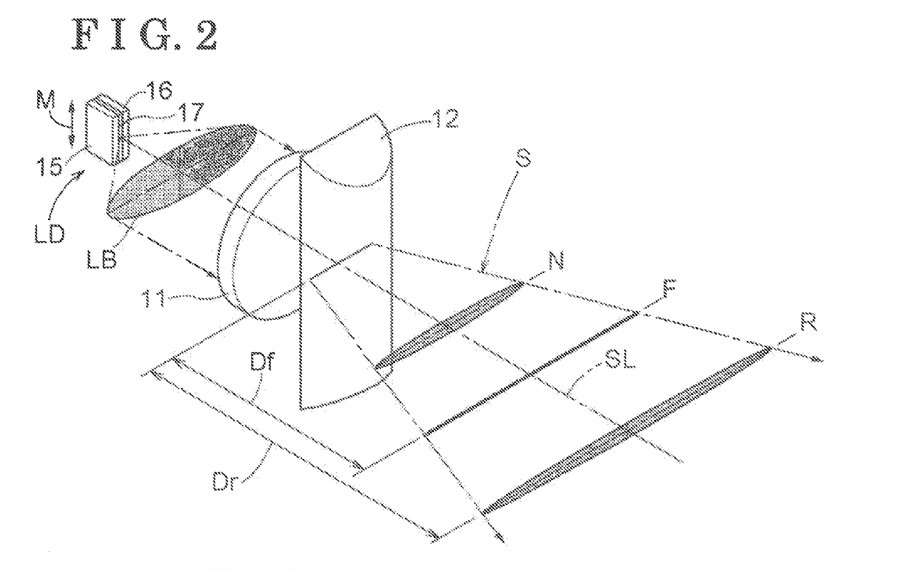
FIG. 2 is a perspective view showing a structure of a laser beam projector according to the embodiment disclosed here.

A construction of the laser beam projector 10 will be explained as follows. As shown in FIG. 2, the laser beam projector 10 includes the single semiconductor laser LD, an incident lens 11 transmitting the laser beam LB, and a cylindrical lens 12 which produces the sheet of light S by transmitting the laser beam LB to propagate to form a plane in a sector shape. The incident lens 11 and the cylindrical lens 12 structure the optical system. For example, a Super Luminescent Diode (SLD), which emits the laser beam with high luminance, is applied as the semiconductor laser LD. The semiconductor laser LD is formed with a p-clad 15, an n-clad 16, and an active layer (light emitting layer) 17 arranged along a boarder portion of a p-n junction and arranged in a linear direction M. By applying an electric voltage to the p-clad 15 and the n-clad 16, as shown in FIG. 2, the laser beam LB in a form of an elliptic beam is emitted from the active layer (light emitting layer) 17.

By arranging the linear direction M of the active layer (light emitting layer) 17 of the semiconductor laser LD in an upward-downward direction, the laser beam LB emitted from the active layer (light emitting layer) 17 is assumed to be an elliptic beam whose longitudinal axis is transversely arranged. The laser beam LB is transmitted through the incident lens 11 to the cylindrical lens 12, then transmitted through the cylindrical lens 12 to form a sector shape as the sheet of light S to converge (focus) to a linear state in which a thickness is the thinnest (upward-downward direction) at a focal position F. Thus, the sheet of light S is assumed to be spread in a transverse direction in a state where the linear direction M of the active layer (light emitting layer) 17 of the semiconductor laser LD is arranged in the upward-downward direction, and the linear direction M and the spread direction of the sheet of light S are arranged to be orthogonal to each other.

The relationship in the upward-downward direction and transverse direction is defined based on drawing figures for an explanatory purpose. Thus, a positional arrangement of the laser beam projector 10 is desirably defined as long as the relative position of the linear direction M of the active layer (light emitting layer) 17 and the spread direction of the sheet of light S is arranged to be orthogonal to each other.

The sheet of light S is assumed to be transversely elongated elliptic shape in which a center portion in the spread direction is slightly expanded at a position being away from the semiconductor laser LD with reference to the focal position F (i.e., defined as a predetermined distant position) and a position being closer to the semiconductor laser with reference to the focal position F (i.e., defined as a predetermined closer position) (note that the expanded portion is depicted exaggeratedly for an explanatory purpose).

In order to measure the luminance distribution of the sheet of light S, the position keeping a distance Df (e.g., Df=290 mm) from the cylindrical lens 12 is defined as the focal position F, and the position keeping a distance Dr (e.g., Dr=313 mm) from the cylindrical lens 12 is defined as a predetermined distant position R. The predetermined distant position R is set at the position being further away from the cylindrical lens 12 relative to the focal position F. The luminance distribution of the sheet of light S in the upward-downward direction (thickness direction) at the focal position F is shown in FIG. 3A, and the luminance distribution of the sheet of light S in the upward-downward direction (thickness direction) at the predetermined distant position R is shown in FIG. 3B.

Figure 3A:
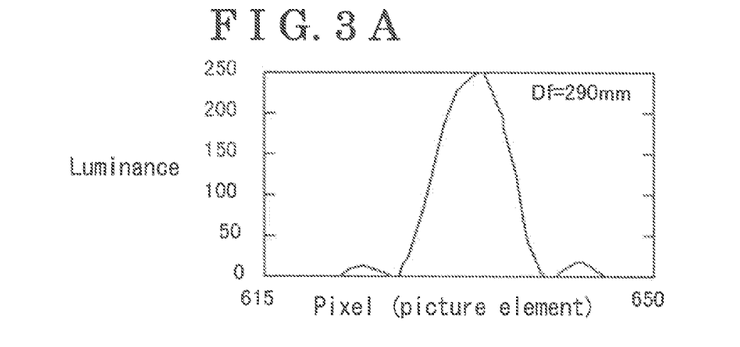
FIG. 3A is a graph showing a luminance distribution at a focal position according to the embodiment disclosed here.
Figure 3B:
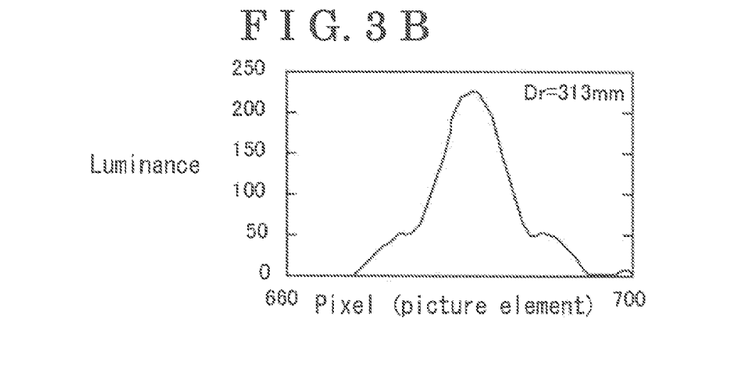
FIG. 3B is a graph showing a luminance distribution at a predetermined distant position according to the embodiment disclosed here.

FIGS. 3A and 3B show luminance values of pixel of an image sensing device while arranging the pixels of the image sensing device which are arranged in the upward-downward direction (thickness direction) in a state where the image sensing device structures with, for example, CMOS or CCD is set at the focal position F and the predetermined distant position R on a horizontal axis. As shown in FIGS. 3A and 3B, the luminance distribution at the focal position F is assumed to be the highest so that the luminance (intensity) at a center position of the sheet of light S in the upward-downward direction (thickness direction) is raised. At the predetermined distant position R, the luminance (intensity) at a center position of the sheet of light S in the upward-downward direction (thickness direction) is assumed to be the highest although the level of luminance is relatively low compared to the level of the luminance at the focal position F, thus, function of the sheet of light S is retained at the predetermined distant position R.

The above explained predetermined distant position R is set at the position being away from the semiconductor laser LD relative to the focal position F. However, the luminance distribution of the sheet of light S at a predetermined close position N closer to the semiconductor laser LD relative to the focal position F appears as similar as the luminance distribution at the predetermined distant position R.

According to the laser beam projector 10, the linear direction M of the active layer 17 of the semiconductor laser LD is set in an attitude to be orthogonal to the spread direction of the sheet of light S. However, a speckle noise can be reduced in a case where the linear direction M of the active layer 17 is set to be unparallel attitude to the spread direction of the sheet of light S. Thus, a relative positional attitude of the linear direction M of the active layer 17 of the semiconductor laser LD and spread direction of the sheet of light S may be set at other angle, for example, 45 degrees.

Figure 4:
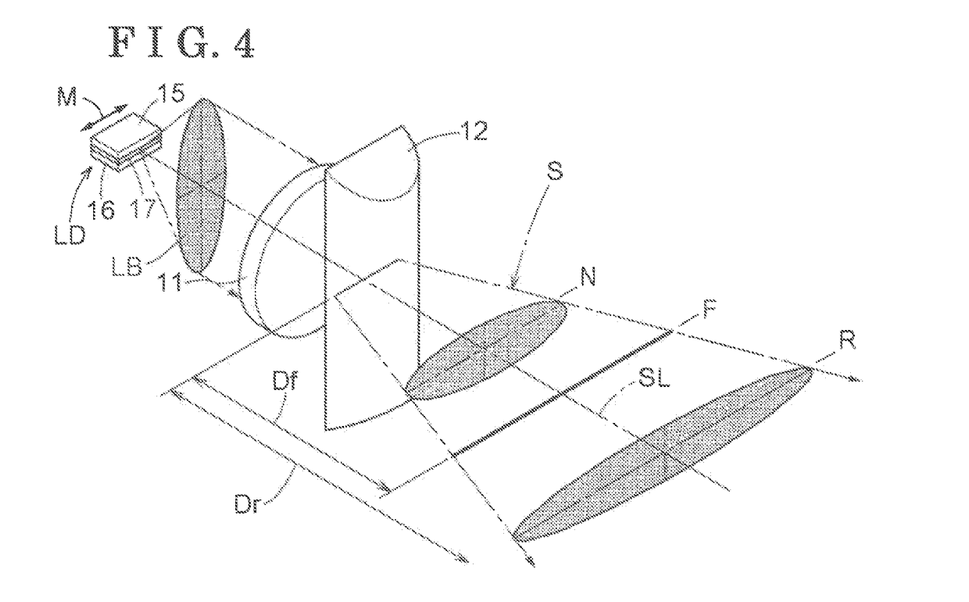
FIG. 4 is a perspective view showing a structure of a laser beam projector according to a comparison example.

A comparison example is shown in FIG. 4. Similar to the laser beam projector 10 of the embodiment, a laser beam projector of the comparison example includes the single semiconductor laser LD, the incident lens 11, and the cylindrical lens 12. However, a positional attitude of the semiconductor laser LD of the comparison example differs from the positional attitude of the laser beam projector 10. That is, according to the comparison example, the linear direction M of the active layer 17 of the semiconductor laser LD is arranged transversely and the spread direction of the sheet of light S is set to be in a transverse attitude so that the linear direction M and the spread direction of the sheet of light S is assumed to be in parallel to each other.

Namely, by arranging the linear direction M of the active layer 17 of the semiconductor laser LD to be transverse, the laser beam LB emitted from the active layer 17 is assumed to be an elliptic beam whose longitudinal axis (major axis) is arranged in an upward-downward direction. The laser beam LB is transmitted to the cylindrical lens 12 via the incident lens 11, is transmitted through the cylindrical lens 12 to form a sector shape as the sheet of light S, and is converged to be a linear state which is assumed to be the thinnest in the thickness (upward-downward direction) at the focal position F.

Further, at the position which is away from the semiconductor laser LD relative to the focal position F and at the position which is closer to the semiconductor laser LD relative to the focal position F, the sheet of light S is assumed to be a transversely elongated elliptic shape at which a portion corresponding to a center portion of the spread direction of the sheet of light S is slightly expanded (note that the expanded portion is depicted exaggeratedly for an explanatory purpose).

The focal position F is defined at a position having a distance Df (e.g., Df=280 mm) from the cylindrical lens 12, and the predetermined distant position R is defined at a position having a distance Dr (e.g., Dr=310 mm) from the cylindrical lens 12, which is further away from the focal position F. The luminance distribution at the focal position F in the upward-downward direction (thickness direction) of the sheet of light S according to the foregoing setting of the comparison example is shown in FIG. 5A, and the luminance distribution at the predetermined distant position R is shown in FIG. 5B.

Figure 5A:
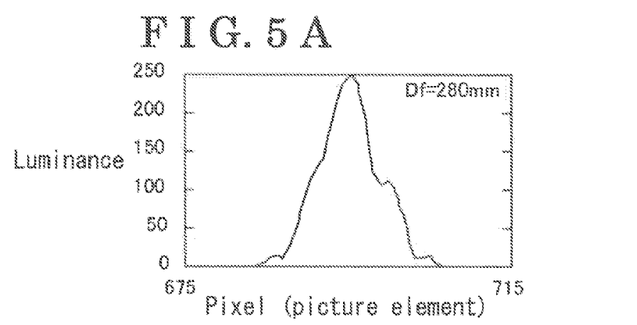
FIG. 5A is a graph showing a luminance distribution at a focal position according to the comparison example.
Figure 5B:
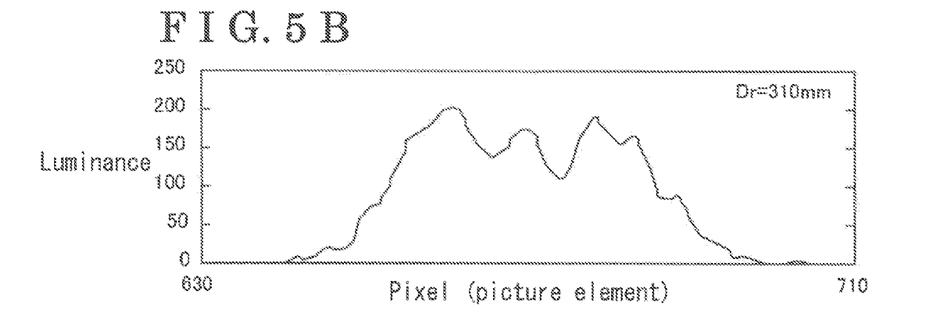
FIG. 5B is a graph showing a luminance distribution at a predetermined distant position according to the comparison example.

FIGS. 5A and 5B show the relationship of pixels of an image sensing device (i.e., the minimum unit of the image sensing device) which is arranged in upward-downward direction (thickness direction) in a state where the image sensing device structured with a CMO or a CCD is set at the focal position F and the predetermined distant position R, and the luminance of the pixel. As shown in FIG. 5A, the luminance distribution is assumed to be the highest at the focal position F at which the luminance at the center position of the sheet of light S in upward-downward direction (thickness direction) is raised. Further, as shown in FIG. 5B, because a peak of the level of the luminance at the focal position F is low and plural peaks of the level of the luminance appear to be in disturbance in the luminance distribution at the predetermined distant position R, the light section line P is assumed to be unclear. Influences of a speckle noise may be a cause of the luminance disturbance shown in the plural peaks of the luminance appearing in a disturbed state.

The above explained predetermined distant position R is set at the position being away from the semiconductor laser LD relative to the focal position F. However, the luminance distribution of the sheet of light S at the predetermined closer position N closer to the semiconductor laser LD relative to the focal position F appears as similar as the luminance distribution at the predetermined distant position R, in which the plural peaks of the luminance appears in the disturbed state.

Figure 6:
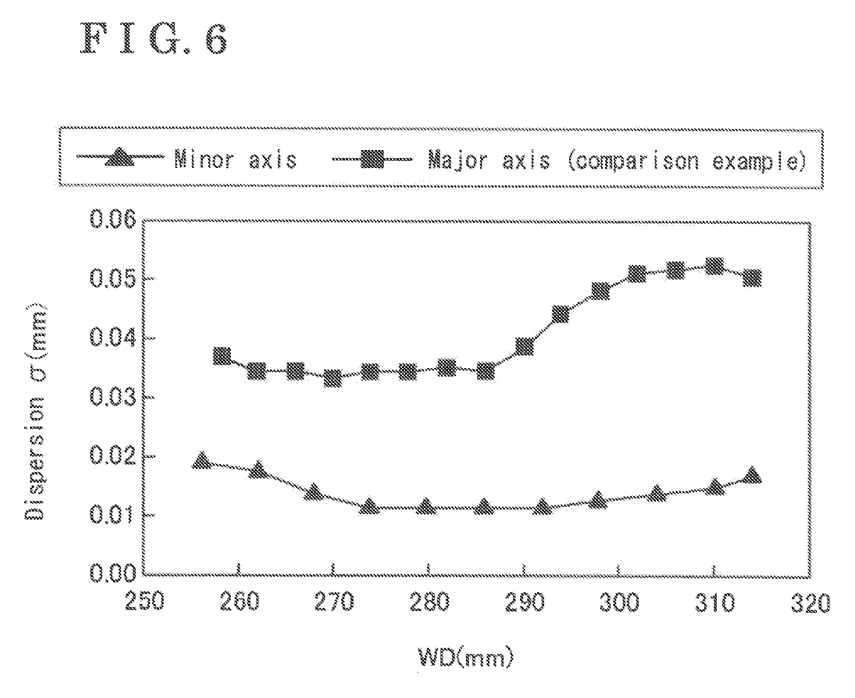
FIG. 6 is a graph showing variations of luminance according to the embodiment disclosed here and according to the comparison example.

Here, a dispersion G in a state where the active layer 17 of the semiconductor laser LD is set at an attitude to be orthogonal to the sheet of light S (i.e., to be parallel to a minor axis (thickness direction) of the sheet of light S), and the dispersion G of the peaks of the luminance in a state where the active layer 17 of the semiconductor laser LD is set at an attitude to be parallel to the sheet of light S (i.e., to be parallel to a major axis (longitudinal direction) of the sheet of light S) are shown in FIG. 6.

FIG. 6 shows the dispersion G of the distribution position of the luminance in the upward-downward direction (thickness direction) of the sheet of light S at predetermined distances from the semiconductor laser LD in a state where the distance Df (e.g., Df=280 mm) is set at the focal position F. Accordingly, the greater the dispersion c is, in the wider range laser beam LB exists in the upward-downward direction (thickness direction). Influences of a speckle noise may be a cause of the existence of the laser beam LB in the wide range of the region.

According to the surface profile inspection device, because the light section line P is projected (produced) on unleveled portion (protruded and recessed portions) on a surface of the work piece W, the position of the light section line P, which is projected on the position deviated from the focal position F to either one of directions closer to or away from the semiconductor laser LD, needs to be obtained, or extracted from the image data. According to the foregoing reasons, as shown in FIG. 5B, when the sheet of light S in which the plural peaks of the luminance appears in disturbance as shown in FIG. 5B is applied, the linewidth of the light section line P of the surface of the work piece W is expanded and the luminance of the light section line P is declined and is assumed to be unstable. Accordingly, in the processing for obtaining, or extracting the light section line P from the image data, precision of weighted average value may decline and/or the weighted average value may not be obtained.

As shown in FIG. 2, in a state where the linear direction M of the active layer 17 of the semiconductor laser LD and the spread direction of the sheet of light S are arranged to be orthogonal to each other, the linewidth of the light section line P is not expanded even at the predetermined distant position R, and the light section line P with the luminance distribution in which the plural peaks of the luminance do not appear (i.e., patterns with bright spots and dark spots do not appear) can be projected. The reasons for generating the sheet of light S with favorable luminance distribution will be explained hereinafter.

That is, as shown in FIG. 4, in a case where the linear direction M of the active layer 17 of the semiconductor laser LD is arranged to be in parallel to the spread direction of the sheet of light S, the laser beam emitted from a narrow light emitting portion arranged along the perpendicular direction relative to the linear direction M of the active layer 17 is propagated in a slit thickness direction (i.e., a direction orthogonal to the spread direction of the sheet of light) to be irradiated. Thus, at a predetermined point of the light section line, because the laser beams with small optical path length differences are converged, the optical coherence is generated. To the contrary, in a case where the linear direction M of the active layer 17 of the semiconductor laser LD and the spread direction of the sheet of light S are arranged to be orthogonal to each other as shown in FIG. 2, the laser beam emitted from the light emitting portion of the wide area in the linear direction M of the active layer 17 (i.e., the laser beam emitted from the light emitting portion in a range of the active layer 17 in the linear direction M) is propagated in the slit thickness direction (i.e., the direction orthogonal to the spread direction of the sheet of light) to be irradiated. Thus, at the light section line P, because the laser beams with large optical path length differences are converged, the generation of the optical coherence is restrained. That is, according to the surface profile inspection device, the generation of the speckle noise by the optical coherence at the light section line P is restrained.

Accordingly, by constructing the laser beam projector 10 to set the linear direction M of the active layer 17 of the semiconductor laser LD and the spread direction of the sheet of light S to be orthogonal to each other (or at least not to be parallel to each other), the linewidth of the light section line P projected on the surface of the work piece W is maintained to be narrow to attain the measurement with high precision in which a fine configuration is favorably determined by restraining the influence of the speckle noise.

A construction of the image capturing unit will be explained as follows. As shown in FIG. 1, the image capturing unit 20 includes a polarizing filter 21, the image capturing lens 22 made from, for example, a telecentric lens, and a two-dimensional image sensing device 23 made from, for example, CMOS or CCD. The image capturing unit 20 is structured similar to a digital camera, and the image capturing unit 20 includes a cover pane. The polarizing filter 21 reduces a noise caused by reflections at a reverse surface of the cover pane by transmitting only P polarized component (i.e., electric wave vector of optical wave being in parallel with a surface of the cover pane, that is, the electric wave vector of optical wave being in parallel with the two-dimensional image sensing device 23) among optical rays from the work piece W. The image capturing lens 22 includes a focus operation mechanism for focusing the image capturing lens 22. The focus operation mechanism is configured to automatically focus the image capturing lens 22, or is configured to focus by manual operation by an operator, or is configured to focus by a control signal form the controller D.

According to the construction of the image capturing unit 20, because the telecentric lens is applied as the image capturing lens 22, the depth of filed is assumed to be deeper and warp of the configuration of the captured image of the work piece W is restrained. Further, according to the image capturing unit 20, a tilted state (a perspective controlled state) may be set by tilting the entire image capturing unit 20 relative to the image capturing axis TL, or the tilted state (the perspective controlled state) may be set by tilting the two-dimensional image sensing device 23 in a state where the optical axis of the image capturing lens 22 is accorded to the image capturing axis TL. According to the foregoing settings, the warp of the work piece W in the image data is restrained and the focusing on the light section line P is enhanced.

How to control the surface profile inspection device will be explained as follows. The controller D includes a processing device main body 31 structured with a computer and a monitor 32 to which results of the processing are outputted. The computer includes a processing system, for example, a CPU and a DSP, and a semiconductor memory in which the information is stored. The processing device main body 31 includes an interface which obtains the information from a keyboard and a pointing device and outputs processing results by the processing system to the monitor 32. The processing device main body 31 further includes a data bus for accessing the data relative to the processing system and a control bus for controlling the access.

A control program is stored in the semiconductor memory of the processing device main body 31. The control program includes a support unit control means 35, an elevation control means 36, a projector control means 37, an image data obtaining means 38, a measurement execution means 39, a three-dimensional data generating means 40 (serving as an example of a configuration data generating unit or a configuration data generating means), an evaluation calculating means 41, and an output means 42. The support unit control means 35, the elevation control means 36, the projector control means 37, the image data obtaining means 38, the measurement execution means 39, the three-dimensional data generating means 40, the evaluation calculating means 41, and the output means 42 are structured with a software as a control program according to the embodiment. However, the construction of the support unit control means 35, the elevation control means 36, the projector control means 37, the image data obtaining means 38, the measurement execution means 39, the three-dimensional data generating means 40, the evaluation calculating means 41, and the output means 42 are not limited and may be structured with hardware or may be structured with a combination of the software and the hardware.

The support unit control means 35 independently actuates the rotatable table 4, the X-stage 5, and the Y-stage 6. The elevation control means 36 sets a height of the measurement unit C by controlling the elevation unit B. The projector control means 37 supplies the electric power to the semiconductor laser LD to irradiate the sheet of light S from the laser beam projector 10. The image data obtaining means 38 controls the image capturing unit 20 to capture images and thus to obtain the image data. The measurement execution means 39 consecutively captures the images while setting the work piece W and the image capturing unit 20 to be a predetermined relative positional relationship by controlling the support unit control means 35 and the image data obtaining means 38. The three-dimensional data generating means 40 serving as the configuration data generating means is configured to specify the position of the light section line P from the obtained plural image data on the basis of the principle of triangulation. The evaluation calculating means 41 compares surface profiles by comparing the measured three dimensional data and the pre-stored reference three-dimensional data 33 (master data). The output means 42 outputs the evaluation results to the monitor 32.

Figure 7:
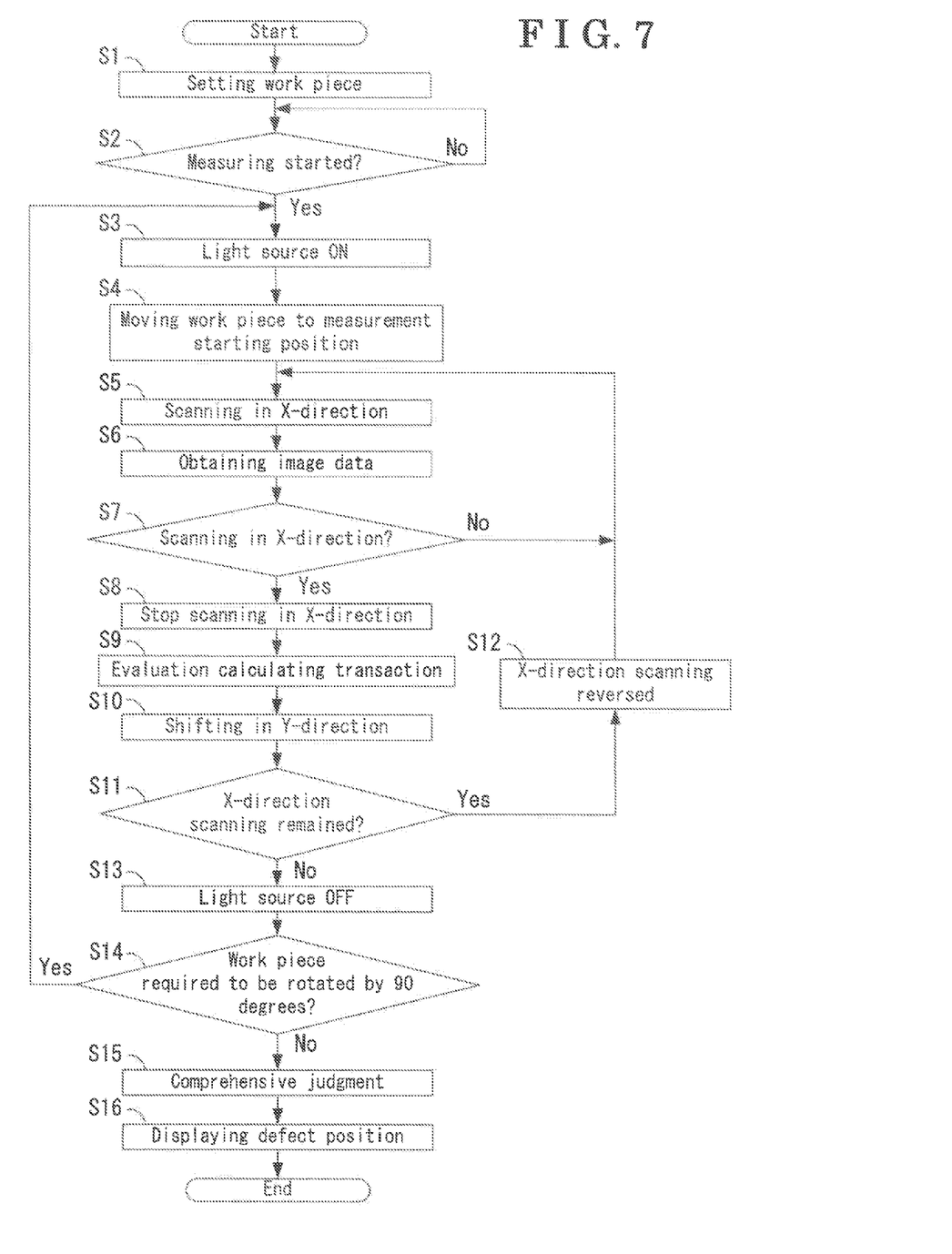
FIG. 7 is a flowchart showing an outline of processes.

An overview of transactions of the processing device main body 31 is shown in a flowchart in FIG. 7. That is, when a button for staring the measurement is operated in a state where the operator sets the work piece W on the rotatable table 4, the measurement is started (Steps S1, S2).

When the measurement is executed, the measurement execution means 39 controls the entire flow of the control. First, the electric power is supplied to the semiconductor laser LD serving as a laser beam source by the laser beam projector 10 by means of the projector control means 37, and the sheet of light S is irradiated to the work piece W (light source ON). Consecutively, after the work piece W is set at the measurement staring position, the image of the work piece W is captured by the image capturing unit 20 while operating the support unit in the X-direction (i.e., an X-direction scanning) to obtain the image data (Steps S3 to S6).

According to the control, the work piece W is set at the measurement staring position by controlling the rotatable table 4, the X-stage 5, and the Y-stage 6 by the support unit control means 35, the image capturing is consecutively performed by the image capturing unit 20 by a predetermined pitch while operating the X-stage 5 with predetermined speed at the X-direction scanning, and the captured plural frames of image data are stored in the semiconductor memory of the processing device main body 31.

The image capturing process is performed until the sheet of light S reaches a side end of the work piece W, and the X-direction scanning is stopped when the sheet of light S reaches a side end of the object to be measured (Steps S7, S8).

In a state where the X-direction scanning is stopped as foregoing, the three-dimensional data generating means 40 generates the measured three-dimensional data from the plural frames of image data on the basis of a laser light section method. Then, the evaluation calculating means 41 performs the evaluation calculation processing for judging whether there are defects on the surface of the object to be measured on the basis of measured point data that is set in the measured three-dimensional data and the reference data of the reference three-dimensional data 33 (master data) (Step S9). Further, when the X-direction scanning is stopped at Step S8, the work piece W is shifted in the Y direction in parallel with the execution of the evaluation calculation processing to examine (check) whether the scanning in the X-axis direction still remains (Steps S10, S11).

According to the foregoing processing, the three-dimensional data generating means 40 obtains, or extracts the light section line P included in the plural image data and the measured three-dimensional data is generated with respect to the obtained or extracted plural light section line P. Thus, when obtaining, or extracting the light section line P from the image data, the positions of edges of the light section line P are specified by an edge detection filter, for example, Sobel filter or Laplacian filter. Further, when judging whether there are defects on the surface of the object to be measured by the evaluation calculating means 41, a congruent transformation including a parallel movement transformation and a rotational transformation is applied to at least one of the measured point data and the reference point data so that the reference data of the reference three-dimensional data 33 (master data) approximate relative to the measured point data determined in the measured three-dimensional data, and an error, or a difference between the measured data and the reference data is obtained after the transaction of the congruent transformation.

A transaction of the evaluation calculating means 41 is not limited to the foregoing, and may be modified as long as obtaining the surface profile of the work piece W based on the light section line P and comparing the obtained surface profile with the surface profile in the master data. Further, when performing the X-direction scanning, the work piece W is divided into block units and the transaction may be set in the X-direction scanning for each of block units.

When the X-direction scanning is remained at Step S11, directions of the X-direction scanning is reversed (Step S12) while shifting in the Y-direction and the X-direction scanning is re-started from Step S05. Further, when the X-direction scanning is not remained at Step S11, the electric power supply to the semiconductor laser LD serving as the laser light source is blocked to stop the irradiation of the sheet of light S (Step S13; light source OFF).

Further, in a case where it is judged that the measurement of the area which cannot be measured in the current setting is necessary, the rotatable table 4 is rotated by ninety degrees (90°) and perform the measurement from Step S3. In a case where the rotation by ninety degrees is insufficient, the rotatable table 4 is rotated further by ninety degrees each time (i.e., the position rotated by 180 degrees from an initial attitude position; the position rotated by 270 degrees from the initial attitude position). In a case where it is not necessary to rotate the rotational table 4 by 90 degrees, a comprehensive judgment is performed based on the defect evaluation result (Steps S14, S15).

In the comprehensive judgment, the position of the defect can be displayed by outputting a defect position display view marked on an overview of the object to be measured by the output means 42 via the monitor 32 or a printer (Step S16).

Effects and advantages of the constructions according to the embodiment will be explained as follows. By setting the linear direction M of the active layer 17 of the semiconductor laser LD to be orthogonal to the spread direction of the sheet of light S, the laser beam emitted from each portion of the wide area in the linear direction M of the active layer 17 is irradiated at a particular point of the light section line P of the surface of the work piece W. Thus, because the laser beams having different optical paths, that is, various laser beams having different optical path length differences are converged, the generation of the optical coherence can be restrained.

Particularly, by setting the attitude of the semiconductor laser LD as the foregoing, the light section line P is projected having the luminance distribution in which plural peaks of the luminance do not appear (i.e., patterns of bright points and dark points are not appeared) both at the predetermined distant position R which is positioned further away from the semiconductor laser LD relative to the focal position F and at the predetermined closer position N which is positioned closer to the semiconductor laser LD relative to the focal position F. Accordingly, the linewidth of the light section line P projected on the surface of the work piece W having stepped portions (unleveled portion (protruded and recessed portions)) on the surface profile is maintained to be narrow (thin), the measurement with high precision for judging the fine profile of the work piece W is performed by restraining the influence of the speckle noise, and the fine defect on the surface of the work piece W is favorably detected to be displayed.

The construction according to the embodiment is applicable to the surface profile inspection devices as long as measuring surface profile of an object to be measured by sheet of light, and is not limited to the surface profile inspection device for detecting defects.

According to the construction of the embodiment, the surface profile inspection device includes the laser projecting unit (10) producing the sheet of light (S) propagating in a linear region forming a plane from a laser beam emitted from a laser light source by an optical system and irradiating the sheet of light to the object to be measured, the image capturing unit (20) capturing an image of the object to be measured, and the configuration data generating unit (40) extracting the light section line (P) defined by the irradiation of the sheet of light (S) on the object to be measured from image data of the image captured by the image capturing unit (20) and generating surface profile data of the object to be measured. The laser light source includes the semiconductor laser (LD) emitting a laser beam from the light emitting layer formed in the linear direction (M) along a boarder of the p-n junction. An attitude of the semiconductor laser is set to arrange the linear direction (M) to be unparallel to the spread direction of the sheet of light (S).

According to the construction of the embodiment (disclosure), the linear direction of the light emitting layer is assumed to be unparallel to the spread direction of the sheet of light. According to the foregoing construction, comparing to the construction in which the linear direction of the light emitting layer is arranged in parallel with the spread direction of the sheet of light, the laser beam emitted from each portion of the wide area of the light emitting layer in the linear direction is irradiated at a predetermined point of the light section line on the surface of the object to be measured. Thus, because the laser beams having different optical paths, that is, the laser beams having different optical path length differences are converged, the generation of the optical coherence is restrained. Thus, the configuration data generating means extracts the light section line with high precision without receiving the influence of the speckle noise deriving from a coherent fringe to generate the surface profile data of the object to be measured from the image data captured by the image capturing means. In consequence, the device is constructed for measuring the surface profile with high precision while reducing the coherent fringe at the light section line projected on the object to be measured by the sheet of light.

According to the construction of the embodiment, the attitude of the semiconductor laser (LD) is set to arrange the linear direction (M) to be orthogonal to the spread direction of the sheet of light (S).

In those circumstances, the linear direction of the light-emitting layer is assumed to be orthogonal to the spread direction of the sheet of light. Thus, the ray from the wide range in the light-emitting layer in the linear direction is emitted in a direction being orthogonal to the spread direction of the sheet of light. Accordingly, the various laser beams having different optical paths, that is, the laser beams having different optical path length differences can be further readily converged to restrain the generation of the optical coherence. Further, by setting the attitude of the semiconductor laser as the foregoing manner, the linear direction of the light emitting layer is directed to be orthogonal to the spread direction of the sheet of light. Namely, the ray from the wide range in the light-emitting layer in the linear direction is emitted in a direction being orthogonal to the spread direction of the sheet of light, and even when the speckle noise is generated because of the coherent fringe, the speckle noise may become inconspicuous, or unnoticeable by overlaying the multiple speckle noises.

According to the construction of the embodiment, the optical system includes the cylindrical lens (12) producing the sheet of light from the laser beam.

According to the construction of the embodiment (disclosure), the laser beam irradiated from the semiconductor laser (LD) can be emitted in a direction to propagate in sheet form (as laser sheet light) by the cylindrical lens.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A surface profile inspection device, comprising:
   a laser projecting unit producing a sheet of light propagating in a linear region forming a plane from a laser beam emitted from a laser light source by an optical system and irradiating the sheet of light to an object to be measured;
   an image capturing unit capturing an image of the object to be measured;
   a configuration data generating unit extracting a light section line defined by an irradiation of the sheet of light on the object to be measured from image data of the image captured by the image capturing unit and generating surface profile data of the object to be measured;
   the laser light source including a semiconductor laser emitting a laser beam from a light emitting layer formed in a linear direction along a boarder of a p-n junction; and wherein
   an attitude of the semiconductor laser is set to arrange the linear direction to be unparallel to a spread direction of the sheet of light.

2. The surface profile inspection device according to claim 1, wherein the attitude of the semiconductor laser is set to arrange the linear direction to be orthogonal to the spread direction of the sheet of light.

3. The surface profile inspection device according to claim 1, wherein the optical system includes a cylindrical lens producing the sheet of light from the laser beam.

4. The surface profile inspection device according to claim 1, wherein
   the attitude of the semiconductor laser is set to arrange the linear direction to be orthogonal to the spread direction of the sheet of light; and
   the optical system includes a cylindrical lens producing the sheet of light from the laser beam.

* * * * *